United States Patent
Tsai et al.

(10) Patent No.: US 9,685,534 B2
(45) Date of Patent: Jun. 20, 2017

(54) METHOD FOR SEMICONDUCTOR DEVICE FABRICATION

(71) Applicant: Taiwan Semiconductor Manufacturing Company, Ltd., Hsin-Chu (TW)

(72) Inventors: Chun Hsiung Tsai, Hsinchu County (TW); Wei-Yuan Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/084,290

(22) Filed: Mar. 29, 2016

(65) Prior Publication Data

US 2016/0211347 A1    Jul. 21, 2016

Related U.S. Application Data

(63) Continuation of application No. 14/332,581, filed on Jul. 16, 2014, now Pat. No. 9,299,803.

(51) Int. Cl.
| | |
|---|---|
| *H01L 21/02* | (2006.01) |
| *H01L 21/312* | (2006.01) |
| *H01L 21/314* | (2006.01) |
| *H01L 21/762* | (2006.01) |
| *H01L 21/76* | (2006.01) |
| *H01L 29/66* | (2006.01) |

(Continued)

(52) U.S. Cl.
CPC .. *H01L 29/66636* (2013.01); *H01L 21/02129* (2013.01); *H01L 21/02164* (2013.01); *H01L 21/02271* (2013.01); *H01L 21/02318* (2013.01); *H01L 21/02343* (2013.01); *H01L 21/02532* (2013.01); *H01L 21/30604* (2013.01); *H01L 21/3105* (2013.01); *H01L 21/31053* (2013.01); *H01L 21/31055* (2013.01); *H01L 21/324* (2013.01); *H01L 29/0847* (2013.01); *H01L 29/167* (2013.01); *H01L 29/66545* (2013.01); *H01L 29/66795* (2013.01); *H01L 29/7848* (2013.01); *H01L 29/161* (2013.01); *H01L 29/165* (2013.01)

(58) Field of Classification Search
CPC .. H01L 29/788; H01L 21/336; H01L 21/8239
USPC ............... 438/694, 591, 787; 257/288, 316, 257/E21.263, E21.282, E21.548, E21.576
See application file for complete search history.

(56) References Cited

U.S. PATENT DOCUMENTS

| | | | |
|---|---|---|---|
| 6,165,822 | A | 12/2000 | Okuno et al. |
| 7,023,018 | B2 | 4/2006 | Buss |

(Continued)

*Primary Examiner* — Kimberly Rizkallah
*Assistant Examiner* — Brian Turner
(74) *Attorney, Agent, or Firm* — Haynes and Boone, LLP

(57) ABSTRACT

Provided is a method of forming a semiconductor device. The method includes providing a substrate; depositing a flowable dielectric material layer over the substrate; performing a wet annealing process and a dry annealing process to the flowable dielectric material layer. The wet annealing process includes a first portion followed by a second portion. The second portion is performed at a temperature above 850 degrees Celsius, and the first portion is performed at a temperature lower than that of the second portion and is performed for longer duration than the second portion. The dry annealing process is performed at a temperature at least 500 degrees Celsius.

20 Claims, 17 Drawing Sheets

(51) Int. Cl.
*H01L 21/324* (2006.01)
*H01L 21/3105* (2006.01)
*H01L 29/167* (2006.01)
*H01L 21/306* (2006.01)
*H01L 29/78* (2006.01)
*H01L 29/08* (2006.01)
*H01L 29/161* (2006.01)
*H01L 29/165* (2006.01)

(56) References Cited

U.S. PATENT DOCUMENTS

| | | | |
|---|---|---|---|
| 7,192,891 | B2 | 3/2007 | Goo et al. |
| 7,667,271 | B2 | 2/2010 | Yu et al. |
| 8,362,575 | B2 | 1/2013 | Kwok et al. |
| 8,367,498 | B2 | 2/2013 | Chang et al. |
| 8,440,517 | B2 | 5/2013 | Lin et al. |
| 8,497,528 | B2 | 7/2013 | Lee et al. |
| 8,598,003 | B2 | 12/2013 | Murthy et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,809,175 | B2 | 8/2014 | Tsai et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 9,263,342 | B2 | 2/2016 | Lee et al. |
| 9,299,803 | B2 | 3/2016 | Tsai et al. |
| 2005/0026443 | A1* | 2/2005 | Goo ............... H01L 21/02164 438/694 |
| 2006/0030165 | A1* | 2/2006 | Ingle ............... H01L 21/02164 438/795 |
| 2006/0263971 | A1 | 11/2006 | Lee et al. |
| 2007/0117412 | A1* | 5/2007 | Goo ............... H01L 21/02164 438/787 |
| 2009/0035917 | A1* | 2/2009 | Ahn ............... H01L 21/02164 438/425 |
| 2010/0258869 | A1* | 10/2010 | Morita ............ H01L 21/76283 257/347 |
| 2011/0068407 | A1 | 3/2011 | Yeh et al. |
| 2011/0147828 | A1* | 6/2011 | Murthy ........... H01L 21/02057 257/327 |
| 2011/0151677 | A1 | 6/2011 | Wang et al. |
| 2012/0322220 | A1* | 12/2012 | Chen ............... H01L 28/40 438/381 |
| 2013/0011983 | A1 | 1/2013 | Tsai et al. |
| 2013/0017678 | A1* | 1/2013 | Tsai ............... H01L 21/28088 438/591 |
| 2014/0252412 | A1 | 9/2014 | Tsai et al. |

* cited by examiner

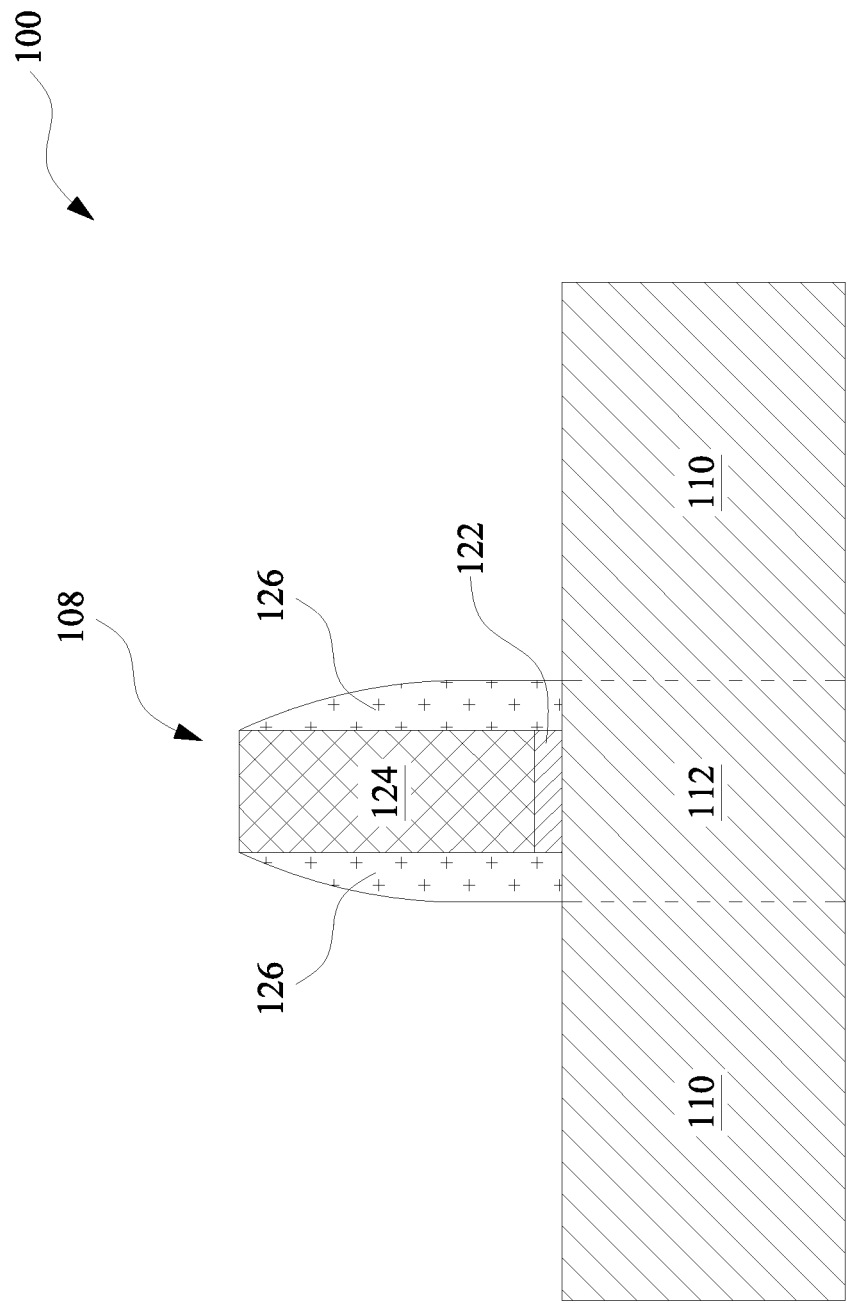

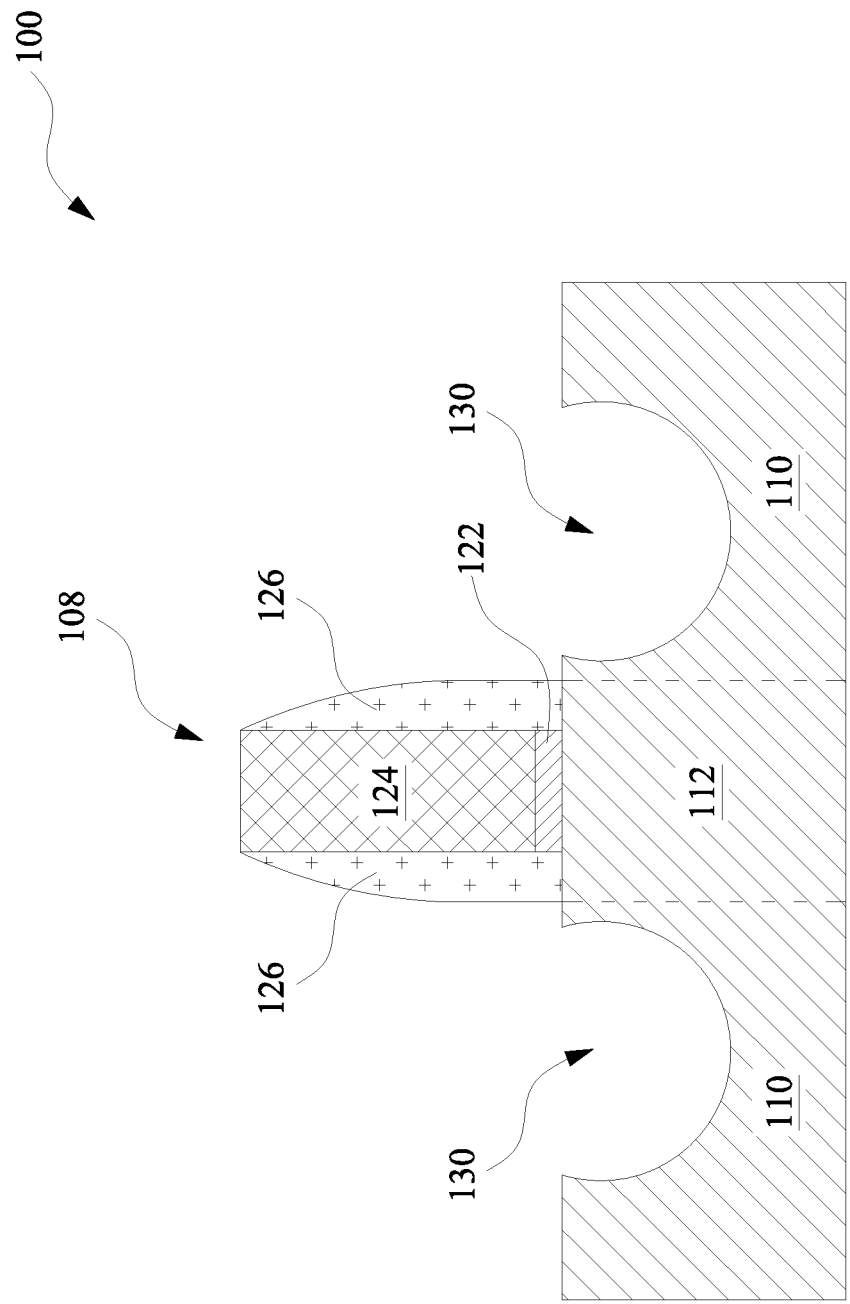

METHOD FOR SEMICONDUCTOR DEVICE FABRICATION

PRIORITY

This is a continuation application of U.S. application Ser. No. 14/332,581, filed Jul. 16, 2014, entitled "Method for Semiconductor Device Fabrication," the entire disclosure of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, when fabricating field effect transistors (FETs), such as fin-like FETs (FinFETs), flowable chemical vapor deposition (FCVD) processes are frequently used in forming a dielectric material layer over a substrate. A typical FCVD process deposits a silicon-containing flowable material on the substrate to fill trenches and subsequently converts the flowable material to a solid material by an annealing process at a high temperature, such as 650 degrees Celsius (° C.). Such high temperature is desirable for creating high density silicon oxide in the solid material. However, it might have negative impact on doped features already existent in the substrate, such as n-type doped source/drain regions. In some cases, the annealing process might totally eliminate the tensile strain in the n-type doped substrate. Accordingly, the existing methods are not satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, and 13 are cross-sectional views of the FinFET device in FIG. 1 fabricated according to the method in FIGS. 2A and 2B, in accordance with some embodiments.

DETAILED DESCRIPTION

Figure 1:
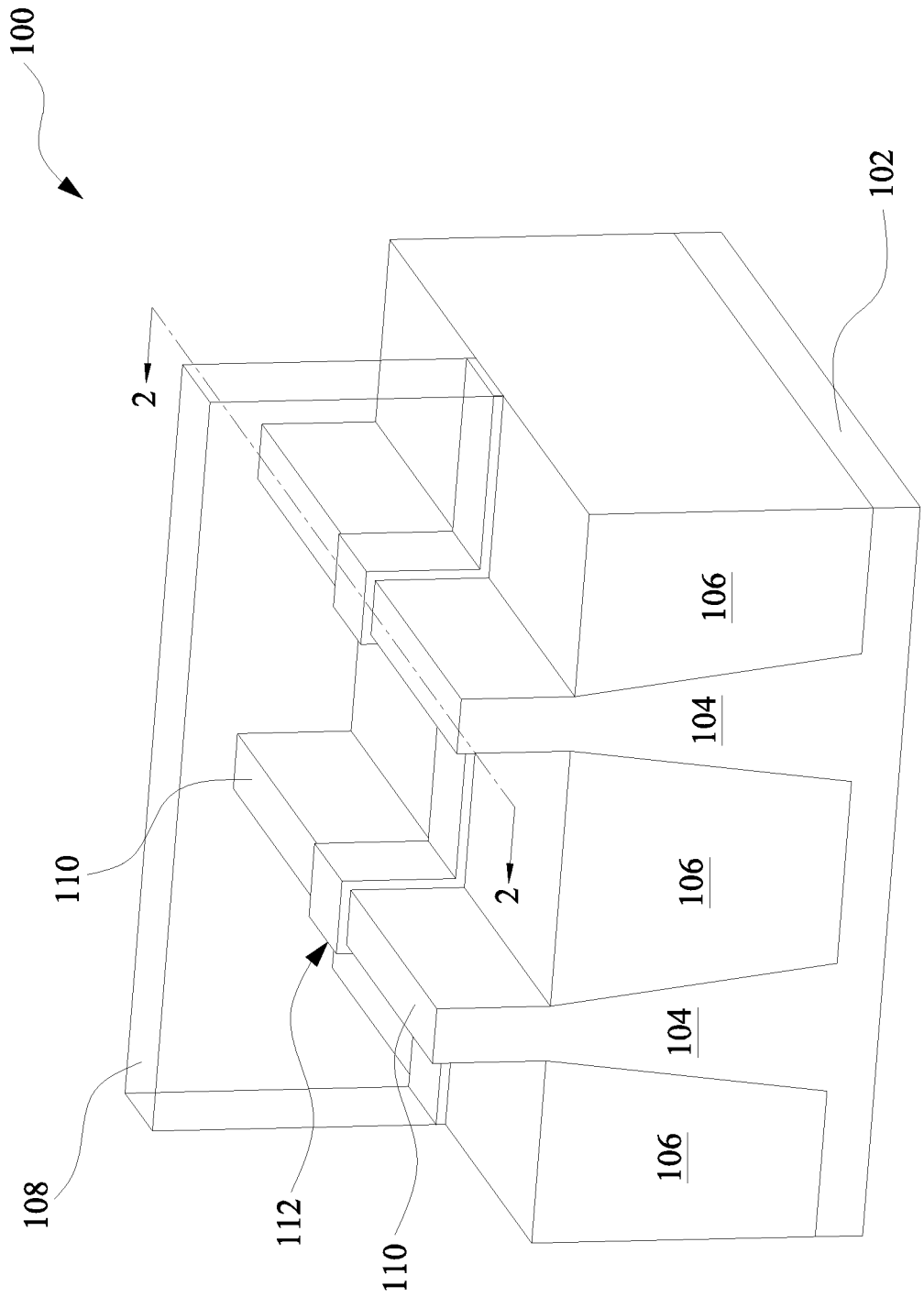
FIG. 1 illustrates a three-dimensional view of a FinFET device in an IC fabrication process, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods of forming a semiconductor device, and more particularly to methods of forming a semiconductor device with n-type doped source/drain regions for achieving proper tensile strain in the device's channel region. With the proper tensile strain, the channel region gains electron mobility and thereby improves conductivity thereof. However, some manufacturing steps performed after the doping of source/drain regions may adversely affect the n-channel tensile strain. For example, flowable chemical vapor deposition (FCVD) process is frequently used to form material layers over the n-type doped source/drain regions in order to form a complete FET device. In a typical FCVD process, a flowable material (such as a liquid compound) is deposited on a substrate with various structures, such as fins in FinFETs, gate structures, and trenches. The flowable material is able to fill the trenches and gaps between the structures. A subsequent annealing process is performed to convert the flowable material to a solid material. In some cases, the annealing process is performed at a high temperature for a prolonged period (e.g., at 650° C. for about one to two hours) in order to form a dense solid material layer desirable for subsequent manufacturing processes. However, it has been found that such annealing process may eliminate the tensile strain in the n-channel, degrading the device performance. This problem is generally referred to as strain relaxation. As semiconductor process technology advances to nanometer (nm) scale, strain relaxation problem has become more and more prominent.

The present disclosure seeks to overcome the aforementioned strain relaxation problem. In various embodiments, the present disclosure uses innovative annealing methods in combination with n-type doping techniques to achieve and maintain proper tensile strain in transistor channels thereby enhancing IC device performance. In the following discussion, an n-type FinFET is used as an example illustrating various aspects of the present disclosure. However, this is not intended to limit the present disclosure beyond what is explicitly recited in the claims. Other type of devices, such as planar transistor devices, double gate FETs, tri-gate FETs, omega FETs, Gate-All-Around (GAA) devices, and vertical GAA devices, can also benefit from various aspects of the present disclosure.

FIG. 1 illustrates a portion of a semiconductor device 100. The semiconductor device 100 includes FinFET type device (s). The semiconductor device 100 may be included in an IC such as a microprocessor, memory device, and/or other IC which may comprise passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, and combinations thereof. FIG. 1 shows the semiconductor device 100 at an intermediate manufacturing step. The device 100 includes a substrate 102, a plurality of fins 104, a plurality of isolation structures 106, and a gate structure 108 disposed on each of the fins 104. Each of the plurality of fins 104 include a source/drain region 110 where a source or drain feature will be formed in, on, and/or surrounding the fin 104. A channel region 112 of the fin 104 underlies the gate structure 108.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI).

The fin structures 104 provide active regions where one or more devices are formed. In an embodiment, a channel of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fin 104 on the substrate 102. The etching process can include dry etching, wet etching, reactive ion etching (RIE), and/or other suitable processes. Alternatively, the fin 104 may be formed by double-patterning lithography (DPL) process. Numerous other embodiments of methods to form the fins 104 on the substrate 102 may be suitable.

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures 106 are STI features and are formed by etching trenches in the substrate 102, e.g., as part of the fin 104 formation process. The trenches may then be filled with isolating material, followed by a chemical mechanical planarization (CMP) process. Other fabrication techniques for the isolation structures 106 and/or the fin structure 104 are possible. The isolation structures 106 may include a multi-layer structure, for example, having one or more liner layers.

The gate structure 108 may include a gate dielectric layer, a gate electrode layer, and/or one or more additional layers. In an embodiment, the gate structure 108 is a sacrificial gate structure such as formed in a replacement gate process used to form a metal gate structure. In an embodiment, the gate structure 108 includes polysilicon. In an embodiment, the gate structure includes a metal gate structure. More details of the gate structure 108 will be described later in this document.

The gate structure 108 engages with the fin 104 on three sides (top and sidewalls) of the fin 104 so as to increase conducting surface of the device 100. This effectively divides the fin 104 into three sections—the source/drain regions 110 adjacent to the gate structure 108 and the channel region 112 underneath the gate structure 108. In the present embodiment, the source/drain regions 110 are to be doped with n-type dopant, such as phosphorus, arsenic, or combinations thereof, which will be discussed in later sections of the document. Proper doping techniques are used to obtain tensile strain in the channel region 112 so that enhanced conductivity can be achieved. As discussed above, such tensile strain needs to be maintained throughout the fabrication process.

Figure 2A:
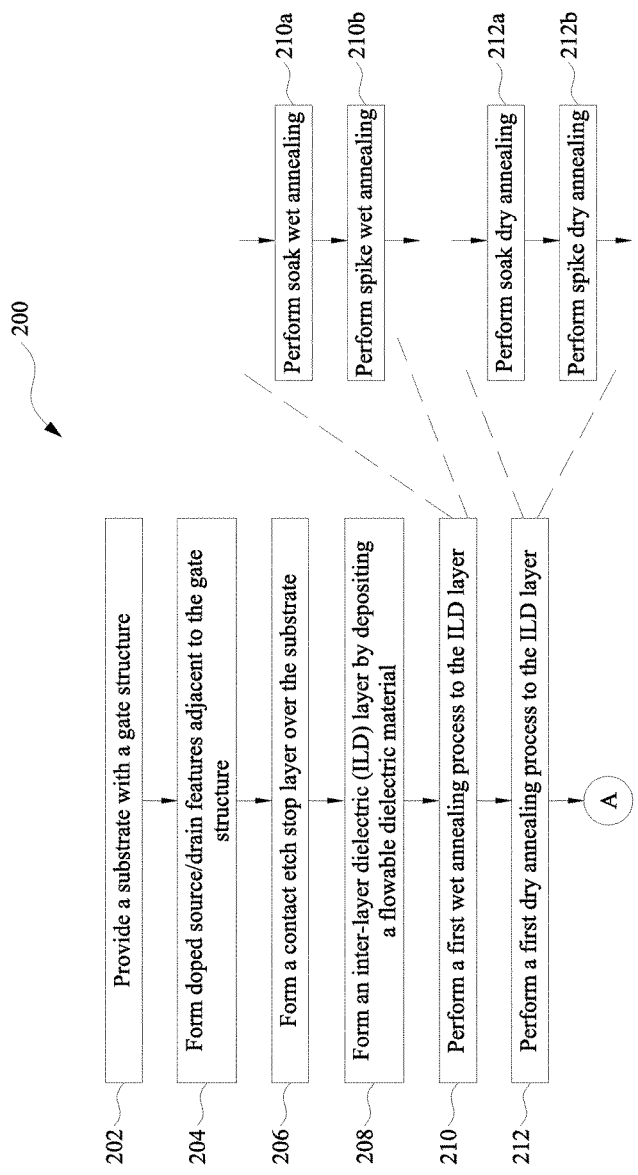
FIGS. 2A and 2B show a block diagram of a method of forming a semiconductor device, according to various aspects of the present disclosure.
Figure 2B:
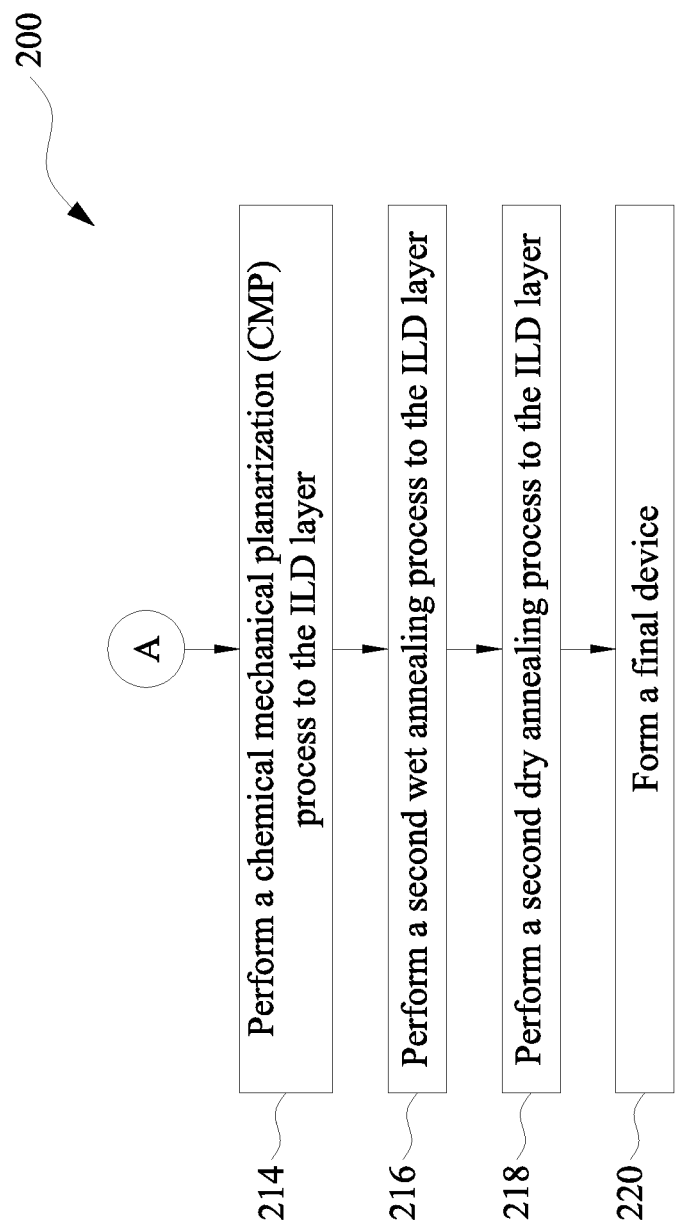

FIGS. 2A and 2B show a block diagram of a method 200 of forming a FinFET device according to various aspects of the present disclosure. One goal of embodiments of the method 200 is that n-type FinFET devices thus formed will achieve and maintain their n-channel tensile strain throughout the fabrication process. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-13 which are cross-sectional views of a portion of the device 100 along the "2-2" line in FIG. 1.

At operation 202, the method 200 (FIG. 2A) provides a substrate with a gate structure, such as the substrate 102 and the gate structure 108 of FIG. 1. Further description of the gate structure 108 is made below with reference to FIG. 3. Referring to FIG. 3, the gate structure 108 includes multiple layers, such as an interfacial layer 122 and a polysilicon (or poly) layer 124. In an embodiment, the gate structure 108 further includes a gate dielectric layer and a metal gate layer disposed between the interfacial layer 122 and the poly layer 124. The interfacial layer 122 may include a dielectric material such as silicon oxide ($SiO_2$) or silicon oxynitride (SiON). The interfacial layer 122 may be formed by chemical oxidation, thermal oxidation, atomic layer deposition (ALD), chemical vapor deposition (CVD), and/or other suitable methods. The poly layer 124 may be formed by suitable deposition processes such as low-pressure chemical vapor deposition (LPCVD) and plasma-enhanced CVD (PECVD). In an embodiment, a hard mask layer is disposed on the gate structure 108 and the hard mask layer may include one or more layers of material such as silicon oxide and/or silicon nitride.

In an embodiment, the gate structure 108 is a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials.

In the present embodiment, the gate structure 108 is surrounded by a spacer 126. The spacer 126 may include materials such as silicon nitride, silicon oxide, silicon oxynitride, and/or other suitable dielectric. The spacer 126 may be formed using suitable deposition and etching techniques and may include a single layer or any plurality of layers. For example, the spacer 126 may include a seal spacer and a dummy spacer disposed on the seal spacer. The seal spacer is formed of silicon nitride and protects the four approximately vertical sides of the gate structure 108 from, e.g., metal diffusion or accidentally shorting with raised source/drain (not shown). The dummy spacer can be a multi-layer structure each composed of silicon oxide, silicon nitride, silicon oxynitride, other dielectric material, or combination thereof. In some cases, the dummy spacer may be used for offset and self-align purposes when the source/drain regions 110 are doped.

The method 200 (FIG. 2A) proceeds to operation 204 to form doped source/drain features in and on the source/drain regions 110 adjacent to the gate structure 108. In the present embodiment, the source/drain regions 110 are doped with an n-type dopant. Various techniques can be used for the operation 204, such as carbon implantation followed by laser annealing. In an embodiment, the operation 204 includes an etching process followed by one or more epitaxy processes, wherein the etching process forms recesses in the source/drain regions 110 and the epitaxy processes form doped features in the recesses, which are shown in FIGS. 4 and 5 respectively.

Referring to FIG. 4, two recesses 130 are formed in the source/drain regions 110 by the etching process, which may be dry (plasma) etching, wet etching, and the like. In an embodiment, one or more photolithography processes are used to form masking elements such that the remaining regions of the device 100 are protected from the etching process. After the etching process, a cleaning process may be performed that clean the recesses 130 with a hydrofluoric acid (HF) solution or other suitable solution.

Figure 5:
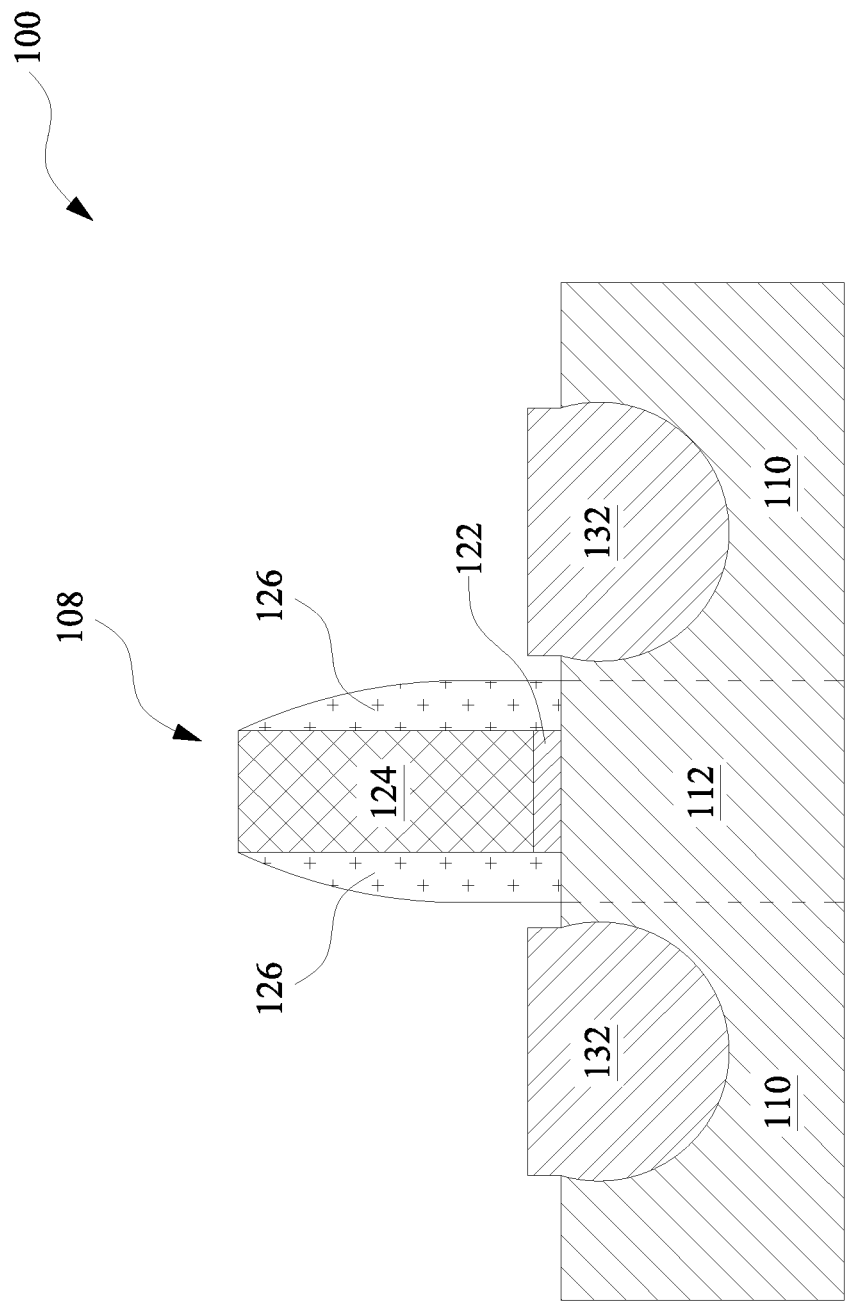
Figure 6:
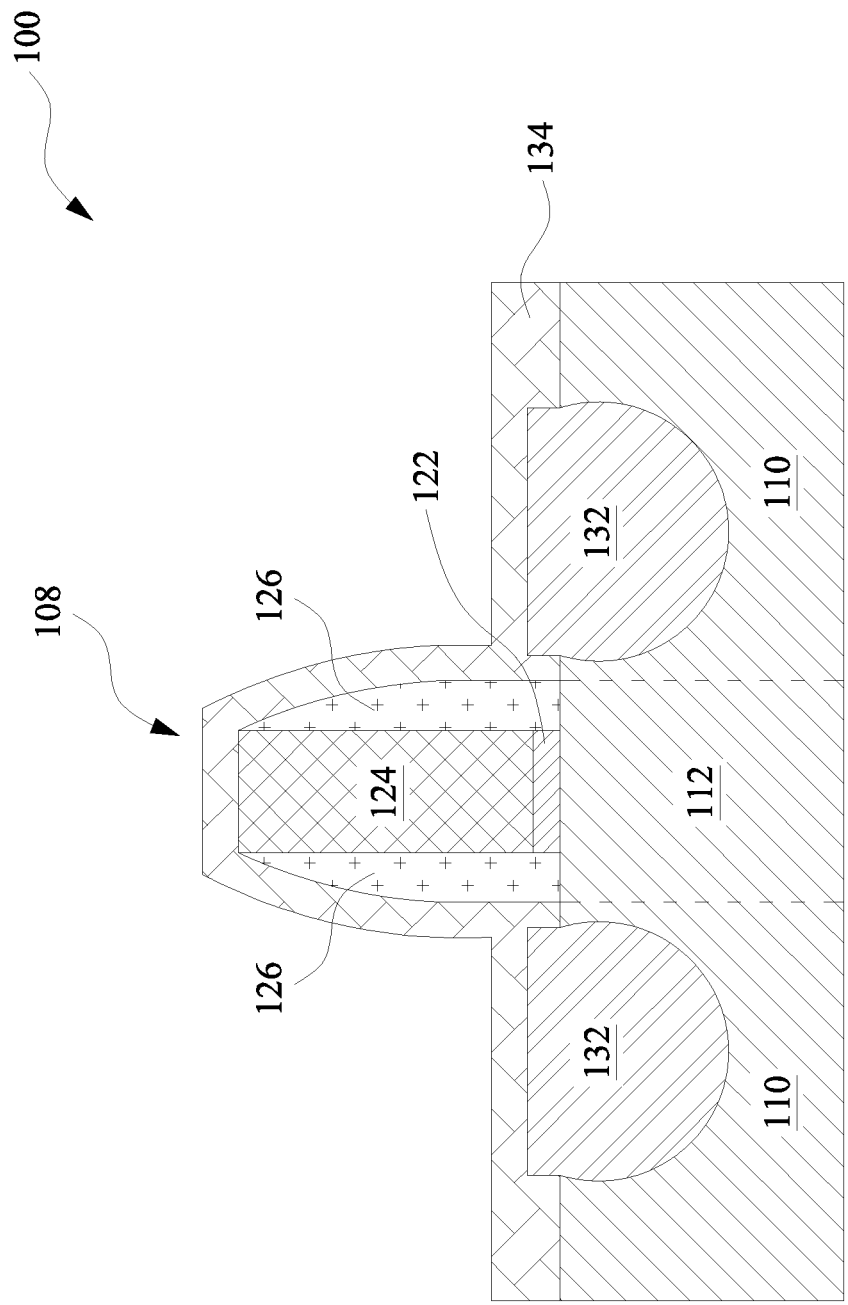

Referring to FIG. 5, doped source/drain features 132 are formed in the recesses 130 (FIG. 4) by one or more epitaxial growth processes. In an embodiment, the epitaxial growth process is a low pressure chemical vapor deposition (LPCVD) process using a silicon-based precursor gas. Further, in the present example, the epitaxial growth process in-situ dopes the grown silicon with an n-type dopant such as phosphorus, arsenic, or combinations thereof for forming the doped source/drain features 132. In an embodiment, the doped source/drain features 132 includes epitaxially grown silicon having a phosphorus dopant concentration ranging from about $1 \times e^{21}$ cm$^{-3}$ to about $4 \times e^{21}$ cm$^{-3}$. In another embodiment, the doped source/drain features 132 includes epitaxially grown silicon having an equivalent carbon dopant concentration ranging from about 1% to about 2.5% and a phosphorus dopant concentration ranging from about $1 \times e^{20}$ cm$^{-3}$ to about $7 \times e^{20}$ cm$^{-3}$. In yet another embodiment, the doped source/drain features 132 includes two layers of epitaxially grown silicon, wherein the first layer has an equivalent carbon dopant concentration ranging from about 1% to about 2.5% and a phosphorus dopant concentration ranging from about $1 \times e^{20}$ cm$^{-3}$ to about $7 \times e^{20}$ cm$^{-3}$ and the second layer is over the first layer and has a phosphorus concentration ranging from about $1 \times e^{21}$ cm$^{-3}$ to about $3 \times e^{21}$ cm$^{-3}$. To further this embodiment, the first layer of silicon is formed to have a thickness ranging from about 4.5 nm to about 7.5 nm and the second layer of silicon is formed to have a thickness ranging from about 22.5 nm to about 45.5 nm. The doped source/drain features 132 create tensile strain in the channel region 112. An annealing process, such as a rapid thermal annealing (RTA) process, is applied to the doped source/drain features 132 to activate the dopant(s) thereof. For example, the RTA process can be performed at a peak temperature of about 950° C. to 1010° C., at a pressure of about 760 torr, and for duration in a range of about 1 second to about 4 seconds. In various embodiments, the doped source/drain features 132 may include additional features, such as silicidation. For example, a silicidation may be formed by a process that includes depositing a metal layer such as nickel, annealing the metal layer such that the metal layer reacts with silicon to form silicide, and thereafter removing the non-reacted metal layer.

Figure 7:
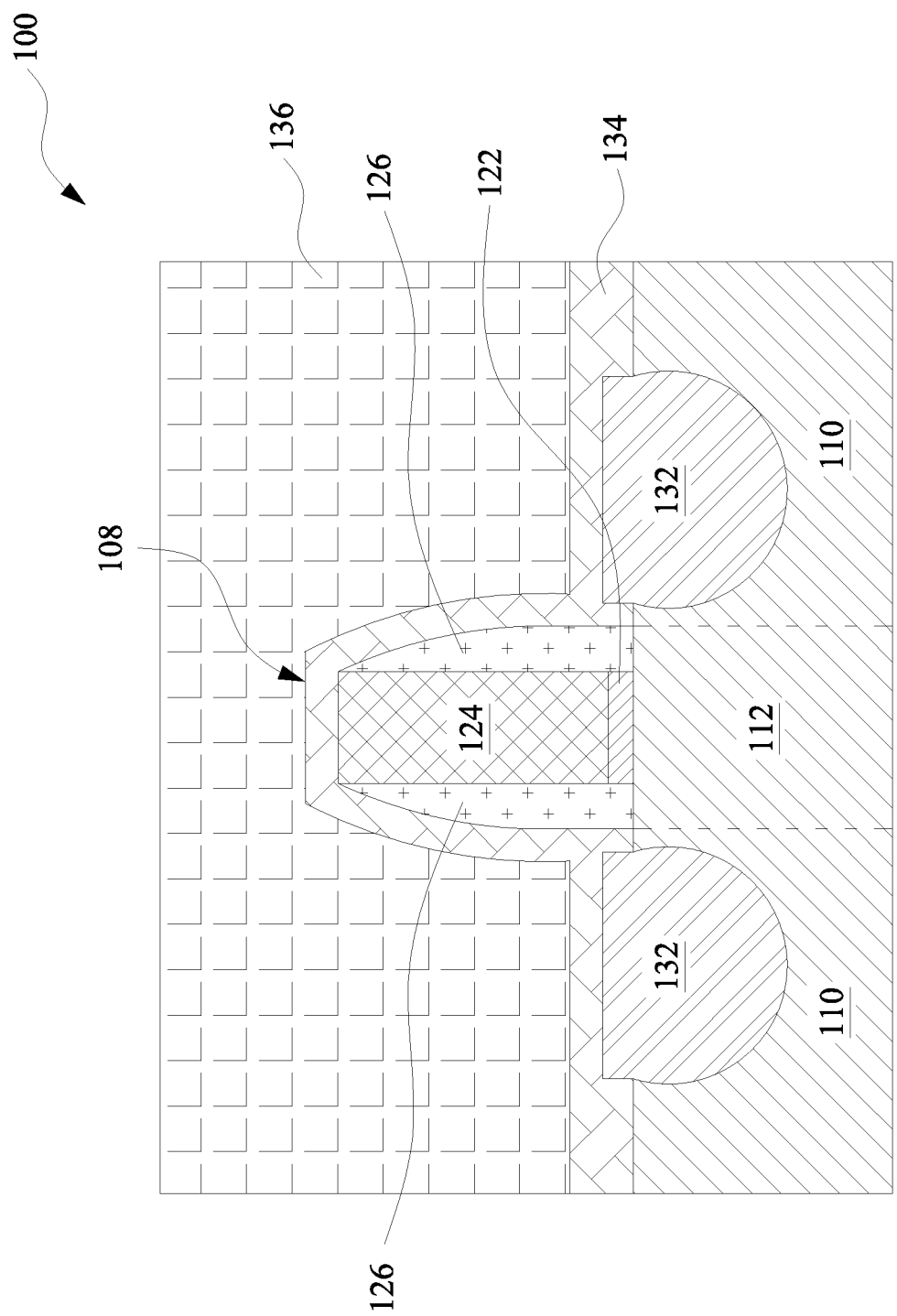

The method 200 (FIG. 2A) proceeds to operation 206 to form a contact etch stop (CES) layer 134 (FIG. 7) over the substrate 102 including the doped source/drain features 132 and the gate structure 108. Referring to FIG. 7, the CES layer 134 may be formed by a plasma enhanced chemical vapor deposition (PECVD) process and/or other suitable deposition or oxidation processes. Examples of materials that may be used to form the CES layer 134 include silicon nitride, silicon oxide, silicon oxynitride, and/or other materials. The CES layer 134 can be used in a subsequent CMP process for detecting a CMP end point. An annealing process is applied to the CES layer 134. For example, the annealing process can be performed at a temperature about 550° C. for about two hours.

The method 200 (FIG. 2A) proceeds to operation 208 to form an inter-layer dielectric (ILD) layer 136 (FIG. 8) over the CES layer 134. In the present embodiment, the ILD layer 136 is formed by depositing a flowable dielectric material over the CES layer 134. The flowable dielectric material fills gaps between structures of the device 100, including the gate structure 108. Such deposition process is desirable for fabricating devices in the nanometer (nm) scale, such as 20 nm or smaller due to its ability to fill small trenches and gaps between structures with high aspect ratios. In some embodiments, the deposition of the flowable dielectric material includes introducing a silicon-containing compound and an oxygen-containing compound. The silicon-containing compound and oxygen-containing compound react to form a flowable dielectric material, thereby filling the trenches. In an embodiment, the material for the ILD layer 136 includes undoped silicate glass (USG). In another embodiment, the material for the ILD layer 136 includes phosphosilicate glass (PSG). In yet another embodiment, the material for the ILD layer 136 includes borophosphosilicate glass (BPSG).

The method 200 (FIG. 2A) proceeds to operation 210 to treat the ILD layer 136 by a wet annealing process (FIG. 8) because untreated flowable dielectric material does not meet later processing requirement. For example, it may not have enough wet etch resistance. Operation 210 converts the flowable dielectric material, at least partially, to a dense oxide material in the ILD layer 136. Operation 210 meets certain thermal budget for the conversion. However, meeting thermal budget alone is not enough. It has been found that if the flowable ILD layer 136 is wet annealed at a high temperature for a prolonged period, for example, at 650° C. for about two hours, the tensile strain in the n-channel 112 may be adversely impacted and may even be totally eliminated in some cases. Therefore, there is a need to meet the thermal budget for converting the flowable dielectric material while maintaining the tensile strain in the n-channel 112. In an embodiment, operation 210 achieves this goal by applying a wet annealing process at a temperature ranging from 150° C. to about 550° C., such as 550° C., for a period ranging from about 100 to about 1,800 seconds. In another embodiment, operation 210 achieves this goal by applying a two-stage wet annealing method. In the first stage (or first portion) of the wet annealing process, the device 100 is annealed at a relatively lower temperature for a relatively longer period. This is shown as operation 210a, soak wet annealing, in FIG. 2A. In the second stage (or second portion) of the wet annealing process, the device 100 is annealed at a relatively higher temperature but for a relatively shorter period (or duration) than the first portion in order not to substantially relax the tensile strain in the n-channel 112. This is shown as operation 210b, spike wet annealing, in FIG. 2A. The first and second portions collectively satisfy thermal budget for treating the flowable dielectric material in the layer 136. In an embodiment, operation 210a is performed below 600° C., such as between 450° C. and 600° C., for at least 10 seconds and operation 210b is performed above 850° C., such as between 850° C. and 1,050° C., for less than 15 seconds.

Figure 14:
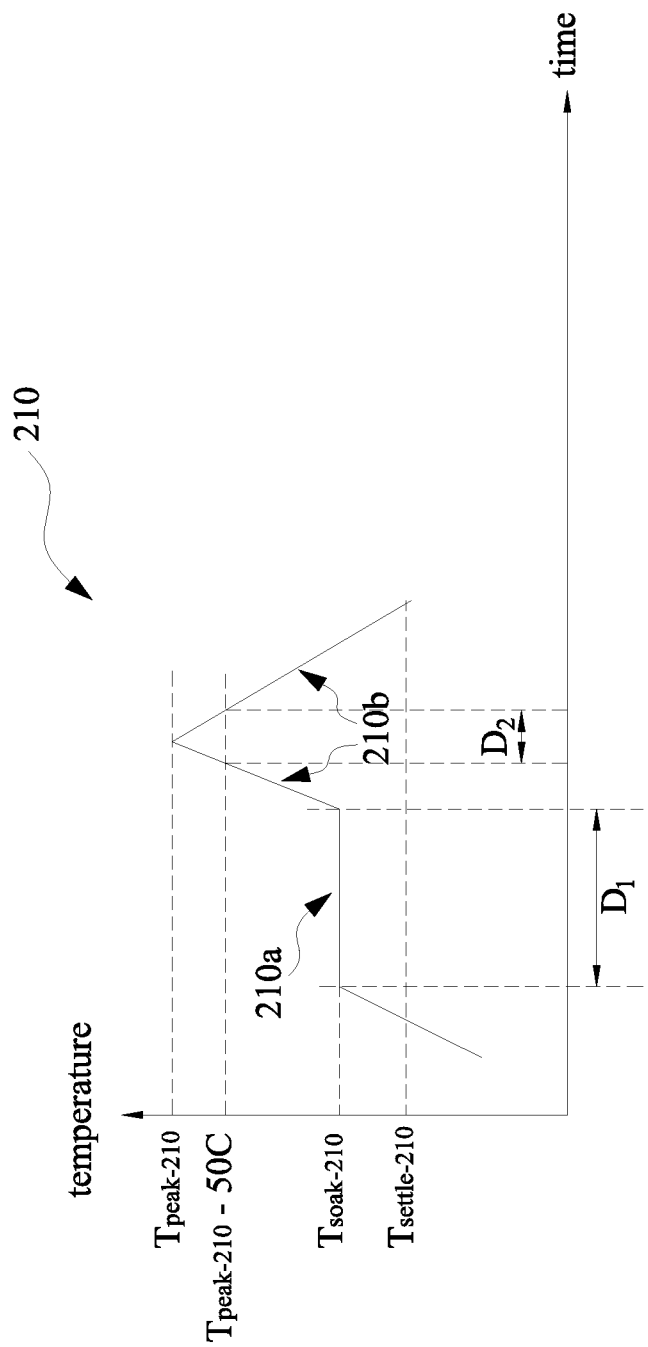
FIGS. 14, 15, and 16 are embodiments of annealing processes used in the method in FIGS. 2A and 2B, in accordance with some embodiments.

Referring to FIG. 14, shown therein is a temperature ramp profile of an embodiment of the operation 210 including the first portion 210a and the second portion 210b. To further this embodiment, the device 100 is placed in a furnace that is heated to a soak temperature $T_{soak-210}$ and maintains roughly the same temperature for the duration $D_1$ of the first portion 210a. In an embodiment, $T_{soak-210}$ is a temperature ranging from about 500° C. to about 550° C. and the duration $D_1$ is in a range from about 10 seconds to about 1,800 seconds, such as from about 10 to 100 seconds or from about 100 to about 1,800 seconds. Still referring to FIG. 14, in the present embodiment, the operation 201b follows the operation 210a. During the operation 210b, the furnace temperature quickly ramps up from the soak temperature $T_{soak-210}$ to a peak temperature $T_{peak-210}$. In an embodiment, this temperature ramp-up rate is at least 50° C. per second. In another embodiment, this temperature ramp-up rate is in a range from about 50° C. per second to about 250° C. per second. In various embodiments, the peak temperature $T_{peak-210}$ is in a range from about 900° C. to about 1,050° C. In the embodiment shown in FIG. 14, the furnace temperature quickly ramps down once it hits the peak temperature $T_{peak-210}$. In an embodiment, this temperature ramp-down rate is at least 50° C. per second. In another embodiment, this temperature ramp-down rate is in a range from about 50° C. per second to about 200° C. per second. Due to its short duration and wide temperature span, the operation 210b is thus referred to as spike (wet) annealing. One way of characterizing the operation 210b's spike is by measuring duration $D_2$ of the spike at a temperature 50° C. below the peak temperature, labeled as "$T_{peak-210}$−50 C" in FIG. 14. In an embodiment, the duration $D_2$ ranges from about 0.7 seconds to about 10 seconds, such as from about 0.7 seconds to about 3 seconds. Although the operation 210b is shown with a triangular profile in FIG. 14, it is not so limited. In various embodiments, it may have more than one peak within the duration $D_2$, may have a flat top, or may have other shapes. After operation 210b completes, the furnace temperature is settled at a relatively low temperature $T_{settle-210}$, suitable for subsequent operations. In some embodiments, $T_{settle-210}$ is lower than the soak temperature $T_{soak-210}$.

Referring back to FIG. 8, during the wet annealing process 210, various gases, in addition to water vapor ($H_2O$), may be introduced into the furnace where the device 100 is held within. These gases help oxidize the flowable dielectric material thereby producing dense silicon oxide in the ILD layer 136. Such gases also have effects of shortening the annealing process. In an embodiment, the wet annealing process 210 is performed in an environment containing $H_2O_2$ which has better steam oxidation efficiency than $H_2O$. Consequently, the operation 210a may be performed at a relatively lower temperature for a relatively shorter period, such as at a temperature in a range from about 100° C. to about 300° C. for about 10 seconds to about 500 seconds. Furthermore, in various embodiments, the wet annealing process 210 is performed in a furnace or chamber having a pressure about 760 Torr.

Figure 8:
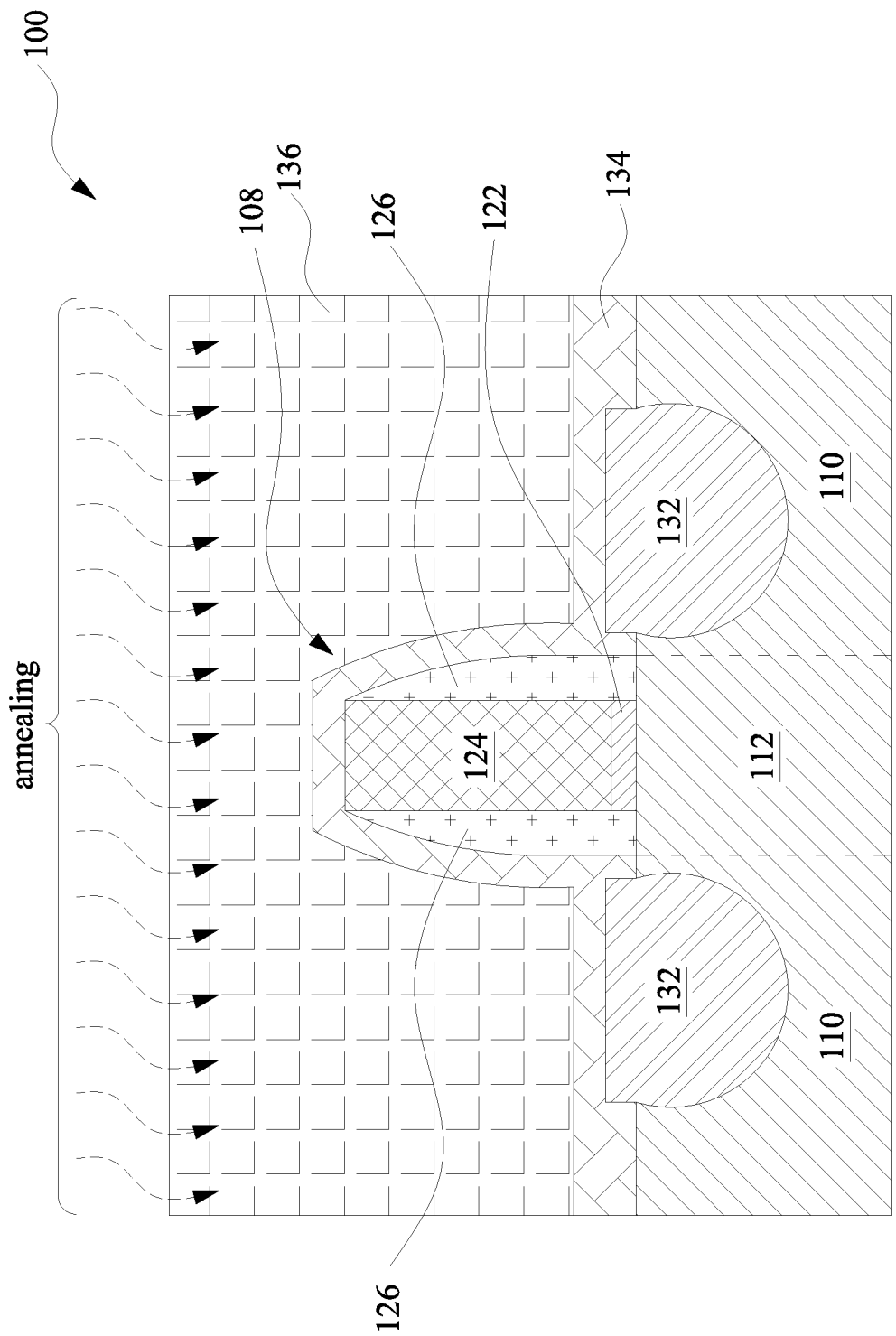
Figure 15:
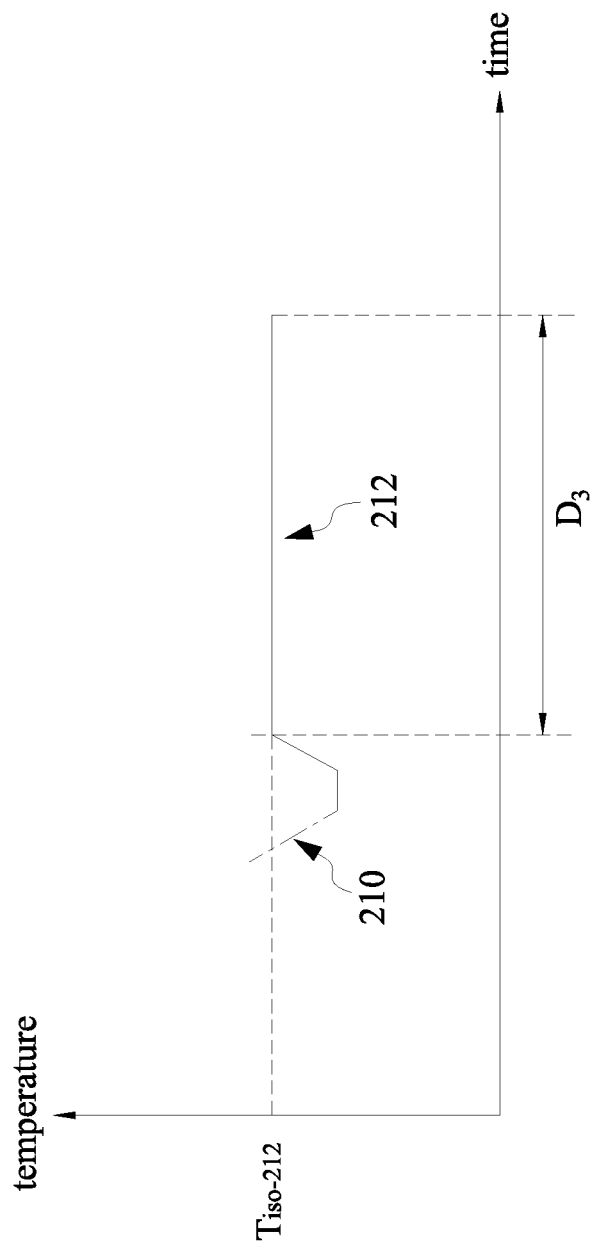
Figure 16:
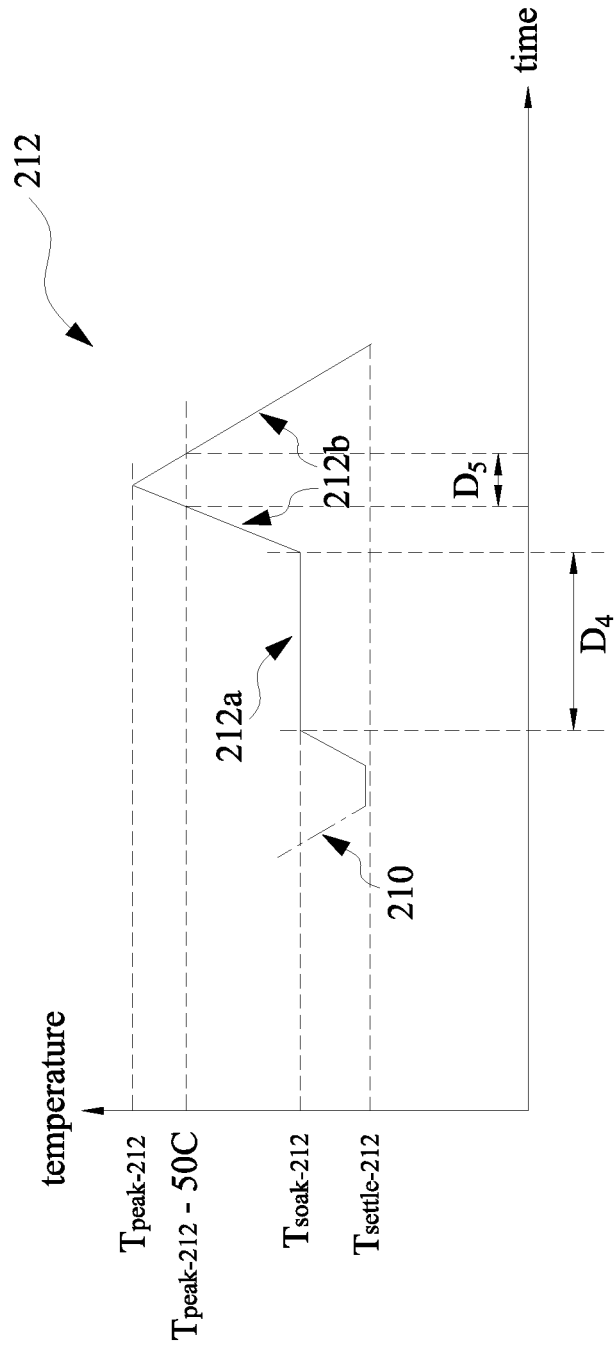

Still referring to FIG. 8, the method 200 (FIG. 2A) proceeds to operation 212 to bake the ILD layer 136 by a dry annealing process, also referred to as the dry annealing process 212 for the sake of convenience. This may take place in the same furnace as the wet annealing process 210 does, or in another chamber. The dry annealing process 212 helps drive solvents out of the ILD layer 136 and may result in further oxidization in the ILD layer 136. FIG. 15 shows an embodiment of the temperature ramp profile of the dry annealing process 212. In an embodiment, the dry annealing process 212 is performed at a temperature $T_{iso-212}$ ranging from about 500° C. to about 1000° C., such as about 650° C., and for a prolonged period $D_3$, such as from about 30 minutes to about 2 hours. It has been found that the dry annealing process 212, even at a high temperature and for a prolonged period, does not materially affect the tensile strain the n-channel 112. FIG. 16 shows another embodiment of the temperature ramp profile of the dry annealing process 212. In this embodiment, the dry annealing process 212 includes two portions 212a (soak dry annealing) and 212b (spike dry annealing) similar to the two portions 210a and 210b in the wet annealing process 210. Using spike dry annealing has advantage of reducing total thermal budget in the annealing processes. Still referring to FIG. 16, the first portion 212a is performed at a temperature $T_{soak-212}$ ranging from about 500° C. to about 550° C. for a duration $D_4$ ranging from about 10 seconds to about 1,800 seconds, such as from about 10 seconds to about 100 seconds. The second portion 212b has a spike profile with a peak temperature $T_{peak-212}$ ranging from about 900° C. to about 1,050° C. and a spike duration $D_5$ ranging from about 0.7 seconds to about 10 seconds as measured at a temperature 50° C. below the peak temperature $T_{soak-212}$. In an embodiment, the duration $D_5$ is in a range from about 0.7 seconds to about 3 seconds. After operation 212b completes, the annealing temperature is settled at a relatively low temperature $T_{settle-212}$, suitable for subsequent operations. In various embodiments, $T_{settle-212}$ may be lower than the soak temperature $T_{soak-212}$. Furthermore, in various embodiments, the dry annealing process 212 is performed in a furnace or chamber having a pressure about 760 Torr.

Even though the FIGS. 14 and 16 show similar temperature ramp profiles for the wet annealing process 210 and the dry annealing process 212 respectively, in various embodiments, these two annealing processes may take different temperature ramp profiles, have different soak and/or peak temperatures, and be performed for different durations.

In various embodiments, the flowable ILD layer 136 may be a relatively thick layer. This happens when the flowable ILD layer 136 is deposited over structures that have high aspect ratios. In one example, the flowable ILD layer 136 has a thickness about 3000 angstrom (A) as it is first deposited. Consequently, the annealing processes 210/212 may not be able to penetrate such a thick flowable material layer. Accordingly, further operations are performed to fully treat the flowable ILD layer 136. To further these embodiments, the method 200 (FIG. 2B) proceeds to operation 214 to perform a chemical mechanical planarization (CMP) process to the ILD layer 136 to thin it down, then proceeds to operations 216 and 218 to perform another set of annealing processes to fully convert the flowable ILD layer 136 to a dense oxide ILD layer 136.

Figure 9:
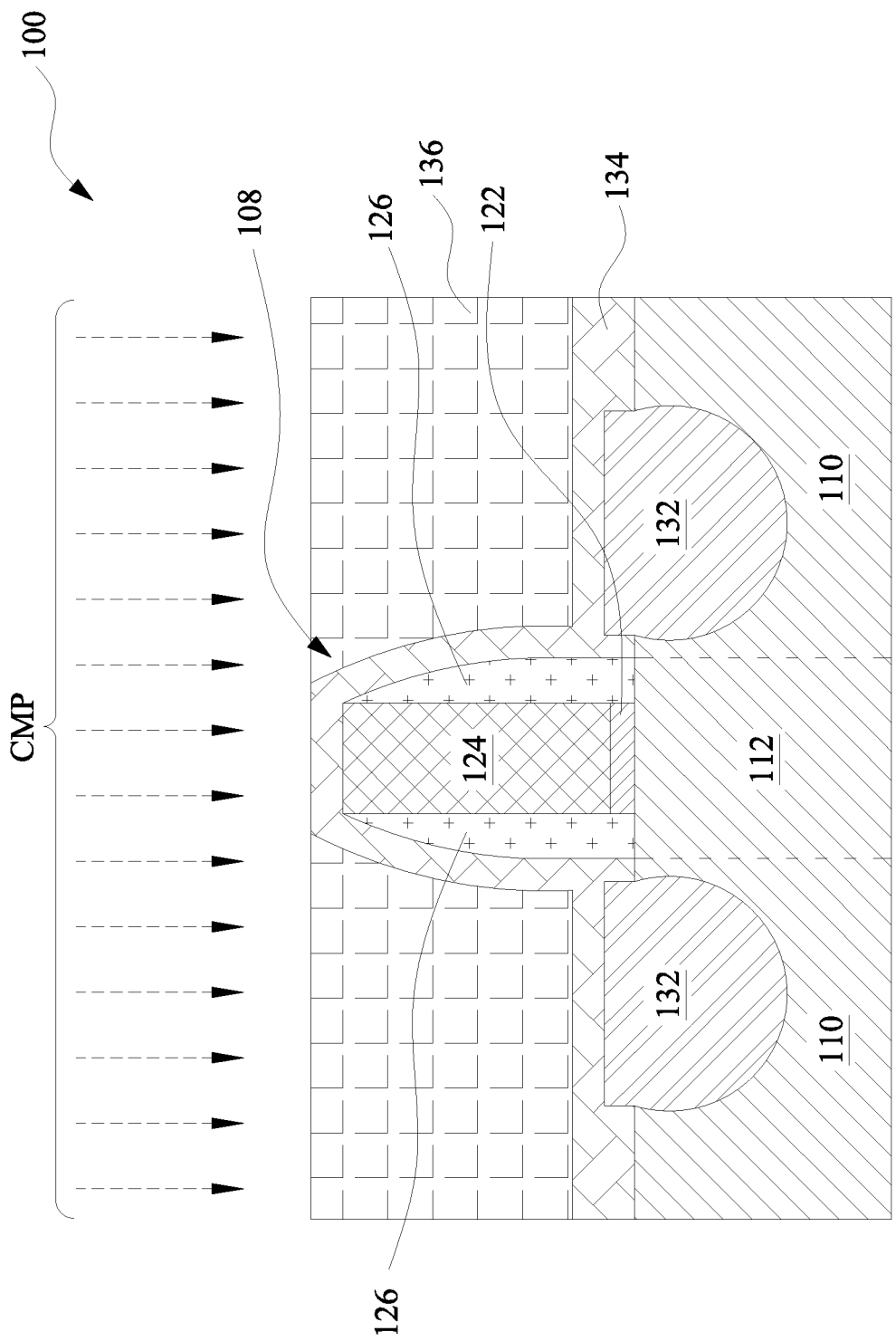

Referring to FIG. 9, shown therein is the flowable ILD layer 136 being thinned down by a CMP process pursuant to the operation 214. In an embodiment, the CMP process stops when a top surface of the CES layer 134 is exposed. This may be implemented as an end point detection using different etch rates between the flowable ILD layer 136 and the CES layer 134.

Figure 10:
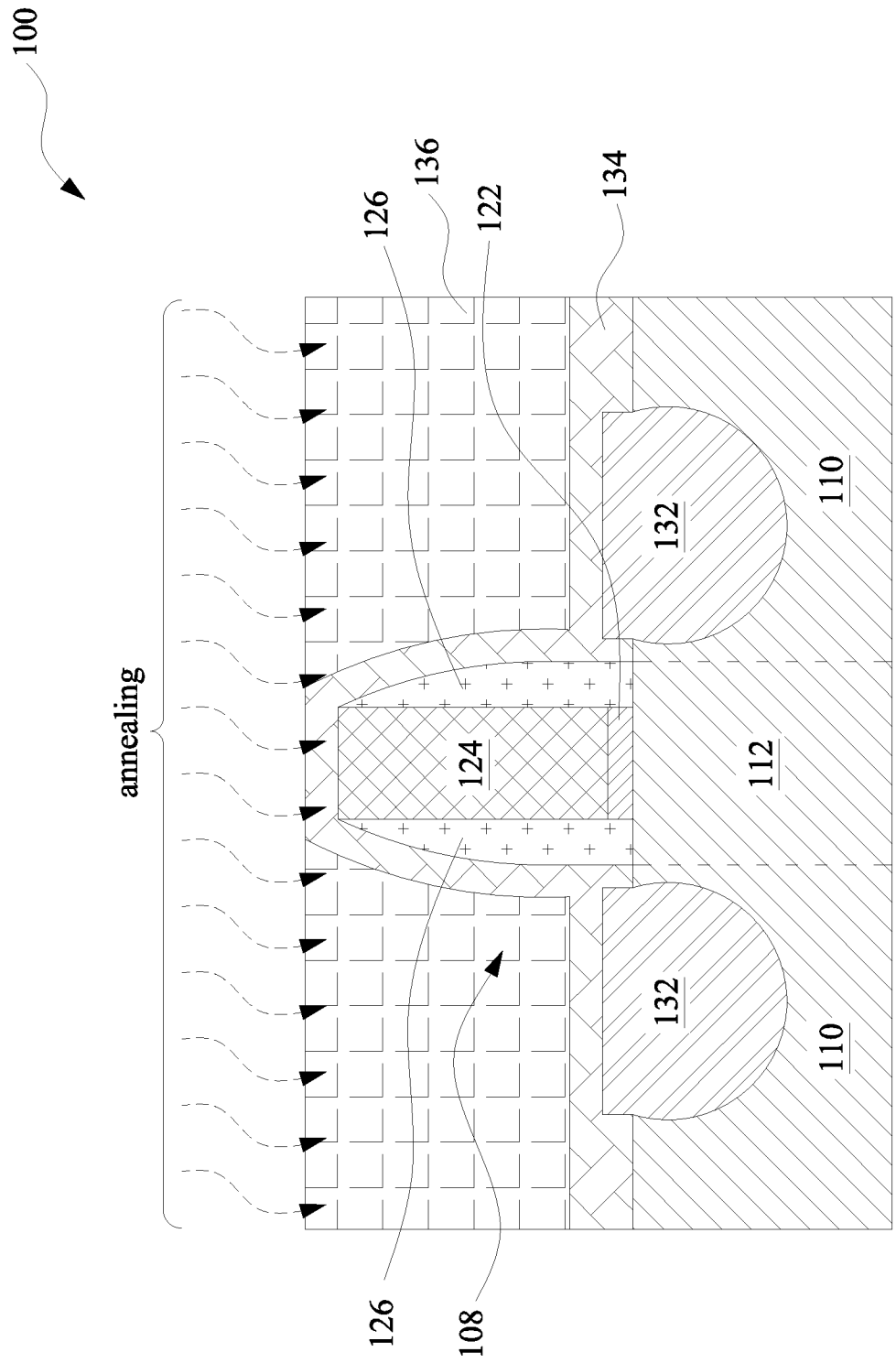

Referring to FIG. 10, shown therein is the flowable ILD layer 136 being treated by a second wet annealing process and a second dry annealing process pursuant to the operations 216 and 218, respectively. Many respects of the operations 216 and 218 are similar to those of the operations 210 and 212 respectively. In an embodiment, the second wet annealing process 216 includes a first portion performed below 600° C. and a second portion having a spike temperature ramp profile with a peak temperature ranging from about 900° C. to about 1,050° C. and a spike duration ranging from about 0.7 seconds to about 10 seconds, such as from about 0.7 seconds to about 3 seconds, as measured at a temperature 50° C. below the peak temperature. In an embodiment, the second dry annealing process 218 includes a first portion performed at a temperature ranging from about 500° C. to about 550° C. for a duration ranging from about 10 seconds to about 1,800 seconds and a second portion having a spike profile with a peak temperature ranging from about 900° C. to about 1,050° C. and a spike duration ranging from about 0.7 seconds to about 10 seconds, such as from about 0.7 seconds to about 3 seconds, as measured at a temperature 50° C. below the peak temperature.

The operations 216 and 218 fully penetrate the flowable ILD layer 136 and convert it to a dense oxide layer. Due to the spike temperature ramp profile of the wet annealing process 216, the tensile strain in the n-channel 112 is not materially affected during the annealing processes.

Figure 11:
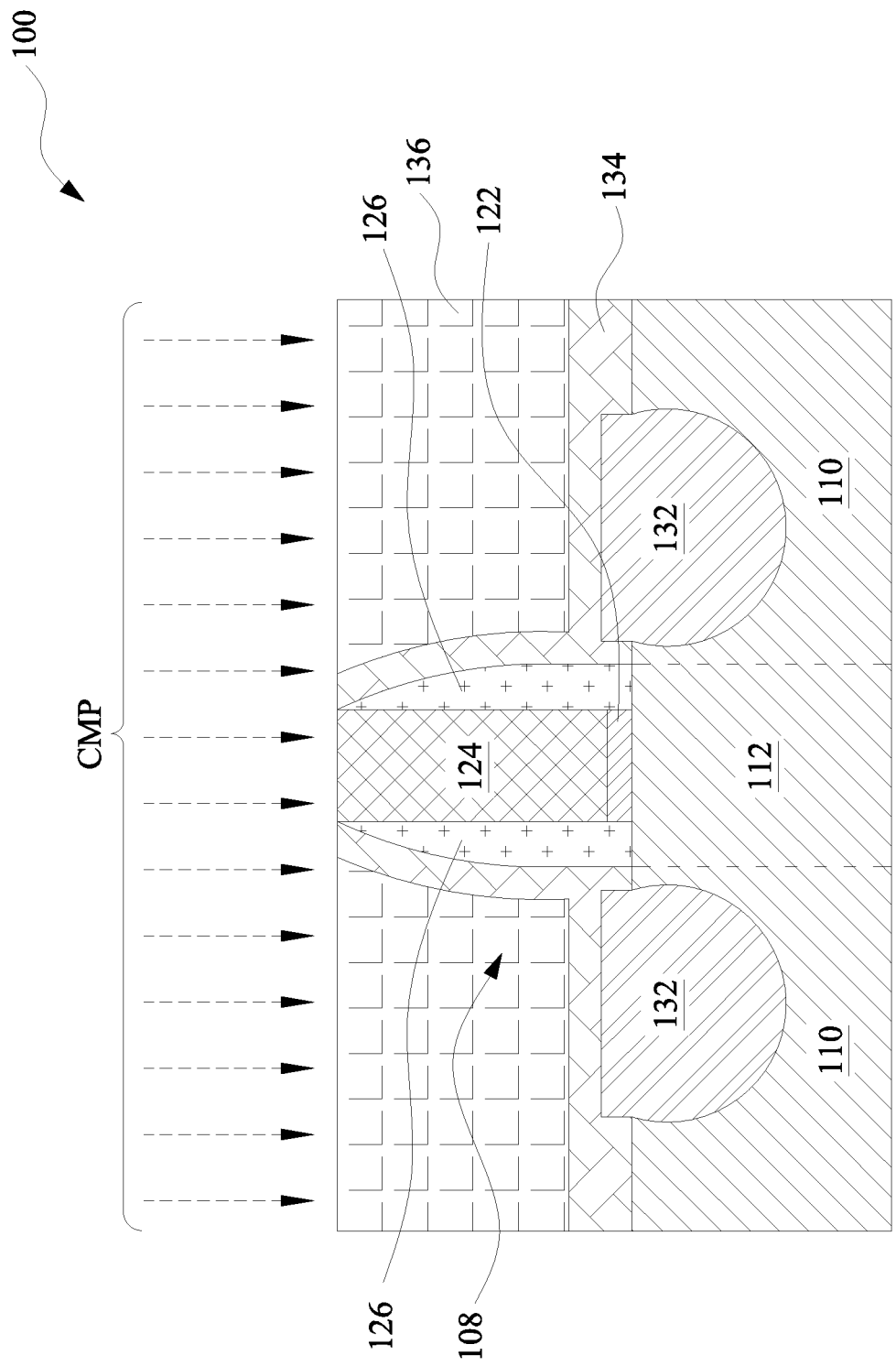
Figure 12:
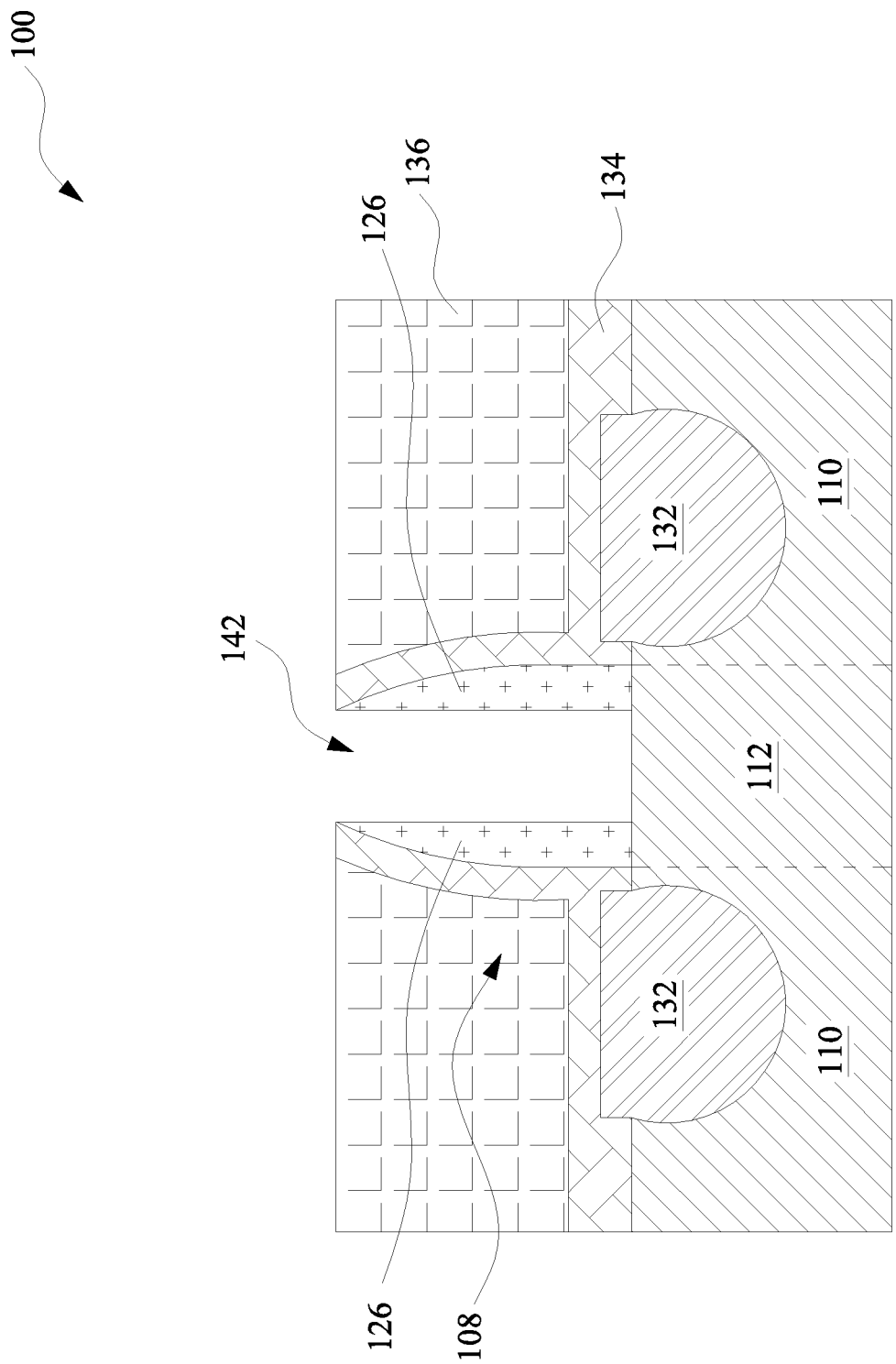
Figure 13:
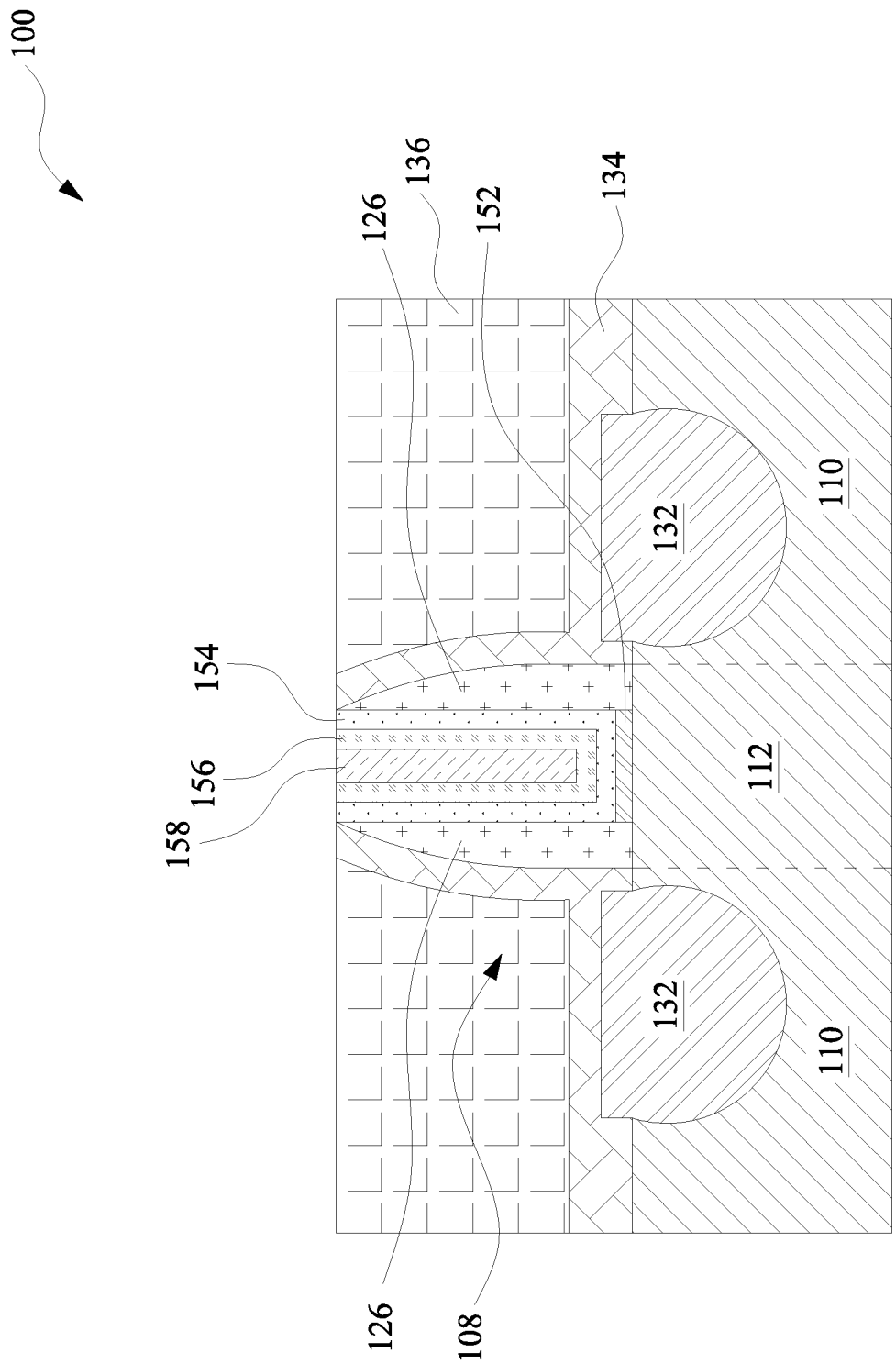

The method 200 (FIG. 2B) proceeds to operation 220 to form a final device by performing further processes. In an embodiment, the method 200 implements a replacement gate process where the interfacial layer 122 and the poly layer 124 of the gate structure 108 are replaced by suitable material layers including metal layers in order to form a metal gate. To further this embodiment, a second CMP process is performed to partially remove the ILD layer 136 and the CES layer 134 thereby exposing the poly layer 124 (FIG. 11). Thereafter, the poly layer 124 and the interfacial layer 122 are removed by one or more etching/cleaning processes to form an opening 142 in the gate structure 108 (FIG. 12). Then, one or more material layers including metal layers are deposited into the opening 142 to form a metal gate stack (FIG. 13). In the example shown in FIG. 13, the metal gate stack includes an interfacial layer 152, a dielectric layer 154, a work function metal layer 156, and a fill layer 158. The interfacial layer 152 may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The dielectric layer 154 may include a high-k dielectric layer such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer 154 may be formed by ALD and/or other suitable methods. In the present embodiment, the work function metal layer 156 is an n-type work function layer. Exemplary n-type work function metals include Ti, Ag, TaAl, TaAlC, TiAlN, TaC, TaCN, TaSiN, Mn, Zr, other suitable n-type work function materials, or combinations thereof. The work function layer 156 may be deposited by CVD, PVD, and/or other suitable process. The fill layer 158 may include aluminum (Al), tungsten (W), or copper (Cu) and/or other suitable materials, and may be formed by CVD, PVD, plating, and/or other suitable processes. The gate stack fills the opening 142 (FIG. 12) of the gate structure 108. A CMP process may be performed to remove excess materials from the gate stack and to planarize a top surface of the device 100. Further processes are performed to complete the device 100.

Although not intended to be limiting, one or more embodiments of the present disclosure provide many benefits to an NFET device and the formation thereof. One benefit is that the NFET device is engineered with proper tensile strain in its channel region. Such tensile strain enhances electron mobility and increases conductivity. Furthermore, such tensile strain is substantially maintained throughout subsequent processes, particularly wet annealing processes employed to convert a flowable material layer to a dense oxide layer. Some embodiments of the present disclosure apply spike annealing methods in wet annealing processes and optionally in dry annealing processes. Such spike annealing methods reduce total thermal budget while maintaining existent n-channel tensile strain.

In one exemplary aspect, the present disclosure is directed to a method of forming a semiconductor device. The method includes providing a substrate, the substrate having n-type doped source/drain features; depositing a flowable dielectric material layer over the substrate; and performing a wet annealing process to the flowable dielectric material layer. The wet annealing process includes a first portion performed at a temperature below 600 degrees Celsius and a second portion performed at temperatures above 850 degrees Celsius, wherein the second portion is performed for a shorter duration than the first portion.

In another exemplary aspect, the present disclosure is directed to a method of forming a semiconductor device, the method includes providing a substrate having a gate structure; forming n-type doped source/drain features adjacent to the gate structure; depositing a flowable dielectric material layer over the substrate; and performing a wet annealing process to the flowable dielectric material layer. The wet annealing process includes a first portion performed below 600 degrees Celsius and a second portion having a spike temperature ramp profile with a peak temperature ranging from about 900 degrees Celsius to about 1,050 degrees Celsius.

In yet another exemplary aspect, the present disclosure is directed to a method of forming a semiconductor device. The method includes providing a substrate, the substrate having a gate structure and n-type doped source/drain features adjacent to the gate structure; forming a contact etch stop (CES) layer over the gate structure and the n-type doped source/drain features; and forming an inter-layer dielectric (ILD) layer over the substrate by depositing a flowable dielectric material. The method further includes performing a first wet annealing process to the ILD layer, wherein the first wet annealing process includes a first portion performed below 600 degrees Celsius and a second portion having a spike temperature ramp profile with a peak temperature ranging from about 900 degrees Celsius to about 1,050 degrees Celsius.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   providing a substrate;
   depositing a flowable dielectric material layer over the substrate;
   performing a wet annealing process to the flowable dielectric material layer; and
   after the performing of the wet annealing process, performing a dry annealing process to the flowable dielectric material layer, wherein:
   the wet annealing process includes a first portion of wet annealing followed by a second portion of wet annealing, the second portion of wet annealing is performed at a temperature above 850 degrees Celsius and the first portion of wet annealing is performed at a temperature lower than that of the second portion and is performed for longer duration than the second portion; and
   the dry annealing process is performed at a temperature at least 500 degrees Celsius and includes a third portion of dry annealing followed by a fourth portion dry annealing, the fourth portion of dry annealing is performed at a temperature above 850 degrees Celsius, and the third portion of dry annealing is performed at a temperature lower than that of the fourth portion and is performed for longer duration than the fourth portion.

2. The method of claim 1, wherein:
   the third portion of dry annealing is performed at a temperature ranging from 500 degrees Celsius to 550 degrees Celsius for a period ranging from 10 seconds to 1,800 seconds; and
   the fourth portion of dry annealing has a spike temperature ramp profile with a peak temperature ranging from 900 degrees Celsius to 1,050 degrees Celsius and a spike duration ranging from 0.7 seconds to 10 seconds as measured at a temperature 50 degrees Celsius below the peak temperature.

3. The method of claim 1, wherein the first portion of wet annealing is performed at a temperature below 600 degrees Celsius for at least 10 seconds.

4. The method of claim 1, wherein the second portion of wet annealing is performed for less than 15 seconds.

5. The method of claim 1, wherein the second portion of wet annealing has a spike temperature ramp profile with a peak temperature ranging from 900 degrees Celsius to 1,050 degrees Celsius and a spike duration ranging from 0.7 seconds to 10 seconds as measured at a temperature 50 degrees Celsius below the peak temperature.

6. The method of claim 5, wherein the spike temperature ramp profile has a temperature ramp-up rate at least 50 degrees Celsius per second and a temperature ramp-down rate at least 50 degrees Celsius per second.

7. The method of claim 1, wherein the wet annealing process is performed in an environment containing $H_2O_2$, and the first portion is performed at a temperature ranging from 100 degrees Celsius to 300 degrees Celsius and for a period ranging from 10 seconds to 500 seconds.

8. The method of claim 1, wherein the substrate includes n-type doped source/drain features.

9. A method of forming a semiconductor device, the method comprising: providing a substrate having a gate structure;
   forming n-type doped source and drain features adjacent to the gate structure;
   depositing a flowable dielectric material layer over the substrate;
   performing a wet annealing process to the flowable dielectric material layer; and
   after the performing of the wet annealing process, performing a dry annealing process to the flowable dielectric material layer, wherein:
   the wet annealing process includes a first portion of wet annealing followed by a second portion of wet annealing, the second portion of wet annealing is performed at a temperature above 850 degrees Celsius, and the first portion of wet annealing is performed at a temperature lower than that of the second portion of wet annealing and is performed for longer duration than the second portion; and
   the dry annealing process includes a third portion of dry annealing followed by a fourth portion of dry annealing, the fourth portion of dry annealing is performed at a temperature above 850 degrees Celsius, and the third portion of dry annealing is performed at a temperature lower than that of the fourth portion and is performed for longer duration than the fourth portion.

10. The method of claim 9, wherein each of the second portion of wet annealing and the fourth portion of dry annealing is performed for less than 15 seconds.

11. The method of claim 9, wherein each of the first portion of wet annealing and the third portion of dry annealing is performed below 600 degrees Celsius, and each of the second portion of wet annealing and the fourth portion of dry annealing has a spike temperature ramp profile with a peak temperature ranging from 900 degrees Celsius to 1,050 degrees Celsius.

12. The method of claim 9, wherein the forming of the n-type doped source and drain features includes:
    etching recesses adjacent to the gate structure; and
    epitaxially growing silicon in the recesses having a phosphorus dopant concentration ranging from $1 \times e^{21}$ $cm^{-3}$ to $4 \times e^{21}$ $cm^{-3}$.

13. The method of claim 9, wherein the forming of the n-type doped source and drain features includes:
    etching recesses adjacent to the gate structure; and
    epitaxially growing silicon in the recesses having an equivalent carbon dopant concentration ranging from 1% to 2.5% and a phosphorus dopant concentration ranging from $1 \times e^{20}$ $cm^{-3}$ to $7 \times e^{20}$ $cm^{-3}$.

14. The method of claim 9, wherein the forming of the n-type doped source and drain features includes:
    etching recesses adjacent to the gate structure;
    epitaxially growing a first layer of silicon in the recesses having an equivalent carbon dopant concentration ranging from 1% to 2.5% and a phosphorus dopant concentration ranging from $1 \times e^{20}$ $cm^{-3}$ to $7 \times e^{20}$ $cm^{-3}$; and epitaxially growing a second layer of silicon over the first layer of silicon, wherein the second layer of silicon has a phosphorus concentration ranging from $1 \times e^{21}$ cm$^{-3}$ to $3 \times e^{21}$ cm$^{-3}$.

15. The method of claim 9, wherein the second portion of wet annealing has a spike temperature ramp profile, the spike temperature ramp profile having a temperature ramp-up rate of at least 50 degree Celsius per second and a temperature ramp-down rate of at least 50 degree Celsius per second.

16. A method of forming a semiconductor device, the method comprising:

provides a substrate, the substrate having a gate structure and n-type doped source and drain features adjacent to the gate structure;

forming a contact etch stop (CES) layer over the gate structure and the n-type doped source and drain features;

forming an inter-layer dielectric (ILD) layer over the substrate by depositing a flowable dielectric material;

performing a first wet annealing process to the ILD layer, wherein the first wet annealing process includes a first portion of wet annealing performed below 600 degrees Celsius and a second portion of wet annealing having a spike temperature ramp profile with a peak temperature ranging from 900 degrees Celsius to 1,050 degrees Celsius;

after the performing of the first wet annealing process, performing a first dry annealing process to the ILD layer at a temperature at least 500 degrees Celsius;

performing a chemical mechanical planarization (CMP) process to partially remove the ILD layer; and after the performing of the CMP process, performing a second wet annealing process to the ILD layer, wherein the second wet annealing process includes a third portion of wet annealing performed below 600 degrees Celsius and a fourth portion of wet annealing having a spike temperature ramp profile with a peak temperature ranging from 900 degrees Celsius to 1,050 degrees Celsius.

17. The method of claim 16, wherein each of the second portion of wet annealing and the fourth portion of wet annealing is performed for less than 15 seconds.

18. The method of claim 16, further comprising:

after the performing of the second wet annealing process, performing a second dry annealing process to the ILD layer at a temperature at least 500 degrees Celsius.

19. The method of claim 18, further comprising:

after the performing of the second dry annealing process, performing another chemical mechanical planarization (CMP) process to the ILD layer and the CES layer until a top surface of the gate structure is exposed.

20. The method of claim 16, wherein the spike temperature ramp profile has a temperature ramp-up rate of at least 50 degree Celsius per second and a temperature ramp-down rate of at least 50 degree Celsius per second.

* * * * *